(12) United States Patent
Yugami et al.

(10) Patent No.: US 6,518,706 B1
(45) Date of Patent: Feb. 11, 2003

(54) METHOD FOR GENERATING A SHORT-PULSED MICROWAVE AND AN EQUIPMENT FOR GENERATING A SHORT-PULSED MICROWAVE

(75) Inventors: Noboru Yugami, Utsunomiya (JP); Yasushi Nishida, Utsunomiya (JP); Hiroaki Ito, Mooka (JP)

(73) Assignee: Utsunomiya University, Utsunomiya (JP)

( * ) Notice: Subject to any disclaimer, the term of this patent is extended or adjusted under 35 U.S.C. 154(b) by 111 days.

(21) Appl. No.: 09/657,801

(22) Filed: Sep. 8, 2000

(30) Foreign Application Priority Data

Sep. 24, 1999 (JP) .............................. 11-269889

(51) Int. Cl.[7] .............................. H05B 31/26
(52) U.S. Cl. ..................... 315/111.81; 315/39; 327/181
(58) Field of Search ........................ 315/39, 111.81, 315/111.71, 111.41, 111.91; 327/305, 291, 100, 181

(56) References Cited

U.S. PATENT DOCUMENTS 4,176,295 A * 11/1979 Driver et al. ................ 315/39
4,329,686 A * 5/1982 Mourou ........................ 324/95
4,642,571 A * 2/1987 Minami et al. ............. 327/100
4,937,500 A * 6/1990 Christophorou et al. ..... 315/150
5,003,225 A * 3/1991 Dandl .................... 315/111.41
5,109,203 A * 4/1992 Zucker et al. ............... 331/172
5,148,129 A * 9/1992 Bolton ........................ 315/39

FOREIGN PATENT DOCUMENTS

| JP | B-44-22643 | 9/1969 |
| JP | 51-69544 U | 11/1974 |
| JP | 07106814 A | 4/1995 |
| WO | WO 95/34829 | 12/1995 |

* cited by examiner

Primary Examiner—Don Wong
Assistant Examiner—Ephrem Alemu
(74) Attorney, Agent, or Firm—Oliff & Berridge, PLC

(57) ABSTRACT

A continuous or a long-pulsed microwave oscillated from a microwave oscillator 1 is propagated in a waveguided tube 2 in which a given gas is charged. Subsequently, by irradiating a laser having a given intensity from a laser source 4 to the points, A and B in the tube 2, the given gas is partially made plasma. Just then, the microwave can not travel beyond the plasma-part of the given gas and reflects thereat. Accordingly, the microwave is divided at the plasma-part and thereby, a short-pulsed microwave can be obtained.

15 Claims, 3 Drawing Sheets

METHOD FOR GENERATING A SHORT-PULSED MICROWAVE AND AN EQUIPMENT FOR GENERATING A SHORT-PULSED MICROWAVE

BACKGROUND OF THE INVENTION

1) Field of the Invention

This invention relates a method for generating a short-pulsed microwave and an equipment for generating a short-pulsed microwave, more particular a method for generating a short-pulsed microwave and an equipment for generating a short-pulsed microwave preferably usable in a microwave-related field such as a high frequency-accelerator and a high frequency-radar.

2) Description of the Prior Art

Recently, in a microwave-related field such as a high frequency accelerator and a high frequency-radar, a microwave is required to be short-pulsed in view of high output power.

In the past, the short-pulsing was carried out through directly short-pulsing a voltage to apply a microwave-oscillation tube and an electron beam to oscillate a microwave.

In the case of short-pulsing the voltage to apply the microwave oscillation tube as above-mentioned, however, a high voltage output-circuit is required to be make low-inductance. Moreover, in the case of short-pulsing the electron beam, an output power from an electron beam-generating power supply is required to be short-pulsed. Thus, as a matter of fact, it is difficult to obtain a short-pulsed microwave having a pulse of not more than around 10 nsec.

SUMMERY OF THE INVENTION

It is an object of the present invention to provide a new method for generating a short-pulsed microwave and a new equipment for generating a short-pulsed microwave which are able to obtain a microwave having a short pulse extremely easily.

This invention relates to a method for generating a short-pulsed microwave comprising the steps of:charging charging a given gas into a waveguided tube, propagating a continuous or a long-pulsed microwave in the waveguided tube, and making plasma the given gas partially by irradiating a laser to the tube in its cross sectional direction and thereby, dividing the continuous or the long-pulsed microwave with the plasma-part of the given gas to obtain a short-pulsed microwave.

This invention relates to a short-pulsed microwave-generating equipment comprising a microwave oscillator to oscillate a continuous or a long-pulsed microwave, a waveguided tube to propagate the continuous or the long-pulsed microwave and a laser source to generate and oscillate a laser to make plasma a given gas charged into the waveguided tube.

The inventors have been intensely studied to find out a new generating method of a short-pulsed microwave, which replaces the conventional generating methods of a short-pulsed microwave. Based on the novel view of generating a continuous or a long-pulsed microwave and thereafter, dividing the microwave to obtain a short-pulsed microwave, not generating a short-pulsed microwave directly according to the conventional method, they tried to short-pulse a microwave.

Accordingly, the inventors have researched and developed a method to divide the continuous or the long-pulsed microwave. As a result, they have found out that by charging a given gas in a waveguide tube to propagate a microwave and making the gas plasma through irradiation of a laser to the waveguide tube from its outside, the continuous or the long-pulsed microwave can be divided.

That is, when the gas charged in the waveguided tube is made plasma, the microwave can not travel beyond the plasma-part of the gas and reflects at the plasma-part. Thus, the continuous or the long pulsed microwave is divided.

According to the present invention, only by controlling the number of the irradiation point of a laser to the waveguided tube and thereby, varying the number of the plasma-part generated in the waveguided tube, the division number of the microwave can be freely changed. Consequently, a microwave having a desired pulse can be obtained easily and freely.

Herein, the wording "continuous microwave" means, so-called, a microwave as a continuous wave which has not-pulsed intensity modulation and is oscillated continuously, and the wording "long pulsed microwave" means a pulsed microwave having a pulse width of around 1000 nsec.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
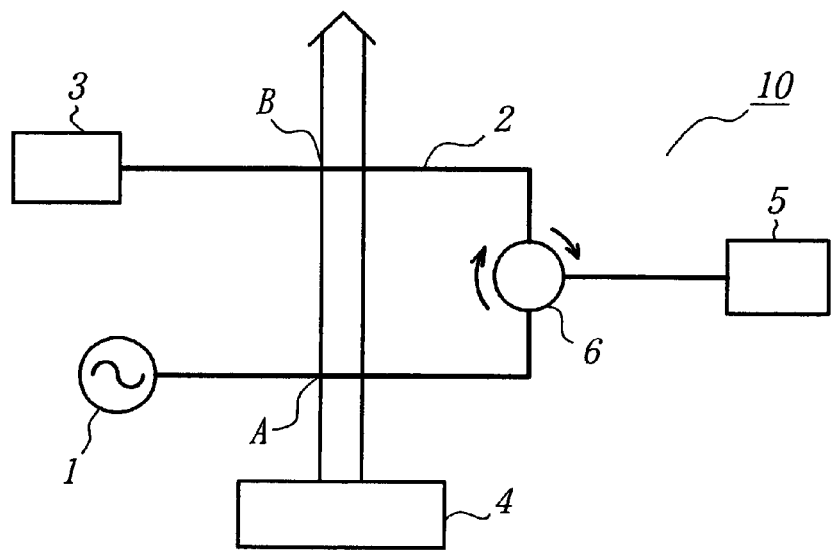
FIG. 1 is a general view for explaining an embodiment in the generating method of a short-pulsed microwave according to the present invention.

The invention will be described in detail as follows:

FIG. 1 is a general view for explaining an embodiment in the generating method of a short-pulsed microwave according to the present invention.

A short-pulsed microwave-generating equipment 10 as shown in FIG. 1 has a microwave-oscillator 1 to generate and oscillate a continuous or a long-pulsed microwave and a waveguided tube 2 to propagate the continuous or the long-pulsed microwave. Moreover, the equipment 10 has a dummy load 3 to absorb the continuous or the long-pulsed microwave propagated and a laser source 4 to make plasma-partially a given gas charged in the waveguided tube 2 through irradiation of laser to the given gas.

Furthermore, the equipment 10 has a microwave detector 5 to detect the divided microwave and an isolator 6 to transmit the divided microwave stably to the microwave detector 5.

A given gas is charged into the waveguided tube 2 and thereafter, a continuous or a long-pulsed microwave from the microwave oscillator 1 is propagated in the tube 2. The continuous or the long-pulsed microwave travel in the tube 2 and is absorbed at the dummy load 3 when the given gas in the tube does not made plasma.

Subsequently, with the continuous or the long-pulsed microwave being propagated, a laser having a given intensity from the laser source 4 is irradiated to two points, A and B of the waveguided tube 2. Just then, the given gas in the tube 2 is partially made plasma in the points A and B. As a result, the continuous or the long-pulsed microwave can not travel beyond the points A and B in the tube 2 and reflects at the points A and B.

Accordingly, the microwave is divided at the right side and the left side of the waveguided tube 2 to obtain a short-pulsed microwaves.

The short-pulsed microwave divided and confined in the right side of the tube 2 travels to the microwave detector 5 via the isolator 6 and is measured about its pulse width, etc.

The pressure of the gas charged in the waveguided tube is not restricted only if the plasma-part of the gas generated by irradiating the laser divides the continuous or the long-pulsed microwave to obtain the short-pulsed microwave. However, the pressure is preferably 1–30 mTorr, more preferably 5–10 mTorr.

Thereby, even the irradiation of the laser having a relatively low intensity can generate the plasma in a high density in the tube, and irrespective of the material, the shape of the tube and the intensity, the frequency of the continuous or the long-pulsed microwave to be divided, the short-pulsed microwave can be easily obtained.

Moreover, the kind of the gas to be charged into the waveguided tube is not restricted only if it is made plasma-partially and thereby, the short-pulsed microwave is obtained. From the same reason as in the gas pressure, azulene or tetrakisdimethylaminoethylene may be preferably used as the gas.

Particularly, in view of being easily made plasma by a favorable laser intensity and laser wavelength as is described below, tetrakisdimethyl-aminoethylene may be preferably used.

The intensity of the laser to be irradiated to the waveguided tube is not particularly restricted only if the plasma-part of the gas generated by irradiating the laser divides the continuous or the long-pulsed microwave to obtain the short-pulsed microwave. However, the intensity is preferably 0.3–0.8 J/cm$^2$.

Thereby, irrespective of the kind of the gas to be charged into the waveguided tube, the material and shape of the tube, and the frequency and intensity of the continuous or the long-pulsed microwave to be propagated, the gas is partially made plasma to obtain the short-pulsed microwave.

The wavelength of the laser is not particular limited only if the short-pulsed microwave can be obtained as mentioned above. However, as the wavelength becomes shorter, the short-pulsed microwave intends to have a shorter pulse. Moreover, as it becomes shorter than 248 nm, which is an oscillation wavelength of an excimer laser, the short-pulsed microwave has a much shorter pulse, so that the short-pulsed microwave can be easily obtained.

Moreover, the laser having the wavelength within the above range, which is irradiated to the gas charged in the waveguided tube, can enhance the plasma density of the gas and make the gas plasma sufficiently.

As a laser source able to oscillate the laser having the above intensity and wavelength, a YAG laser and an excimer laser may be exemplified. Since the YAG laser has an oscillation wavelength of 1060 nm, in using the YAG laser, a fourth harmonic wave of the YAG laser is used.

In the short-pulsed microwave-generating equipment shown in FIG. 1, the microwave travelling in the waveguided tube 2 is divided into two parts at the points A and B. However, the division number of the microwave is not particularly limited and may be selected appropriately, depending on a desired pulse width in the short-pulsed microwave. According to the generating method of the present invention as mentioned above, the short-pulsed microwave having a pulse width of 2–10 nsec can be obtained.

Figure 2:
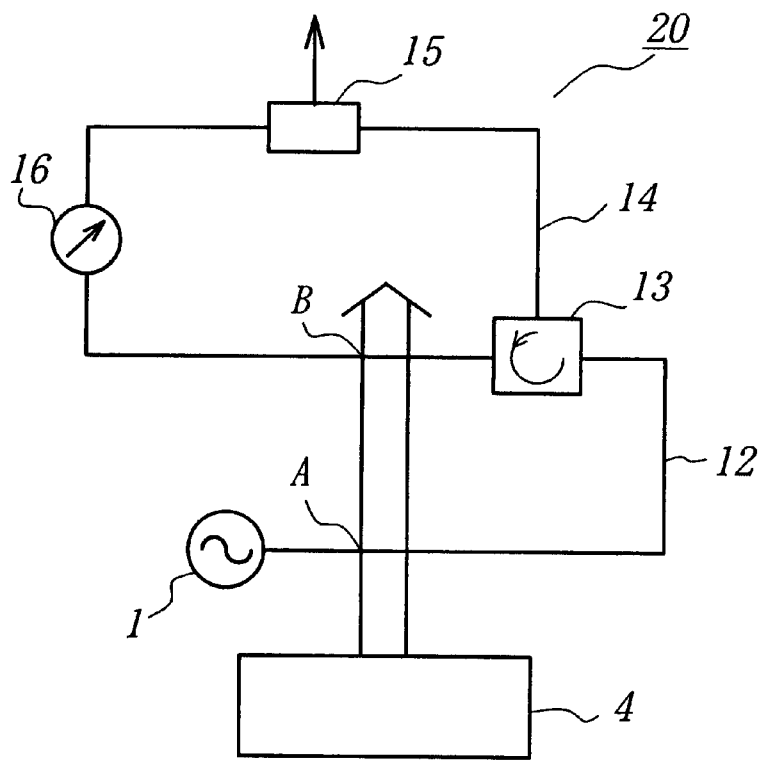
FIG. 2 is a general view for explaining another embodiment in the generating method of a short-pulsed microwave according to the present invention.

FIG. 2 is a general view for explaining another embodiment in the generating method of a short-pulsed microwave according to the present invention. Herein, similar parts to ones in FIG. 1 are denoted by the same references.

A short-pulsed microwave-generating equipment 20 shown in FIG. 2 has a microwave oscillator 1 and a laser source 4 as the generating equipment 10 in FIG. 1. Moreover, the equipment 20 has a first waveguided tube 12 and a second waveguided tube 14. Then, the equipment 20 has a circulator 13 instead of the dummy load 3. The second waveguided tube 14 has a phase-shifter 16 and a magic tee 15.

A continuous or a long-pulsed microwave oscillated from the microwave oscillator 1 travels in the first tube 12 and through the circulator 13, travels in the second tube 14. Subsequently, a laser from the laser source 4 is irradiated to the point A in the first tube 12 and the point B in the second tube 14 to make plasma the gases charged in the tubes corresponding to the points A and B. Just then, as is explained in FIG. 1, the microwave is divided at the points A and B to obtain plural short-pulsed microwaves.

Particularly, the preceding short-pulsed microwave in time of the short-pulsed microwaves divided and generated at the point B in the second waveguided tube, that is, the short-pulsed microwave positioned in the left side of the point B in the second waveguided tube 14 comes to the magic tee 15 through the phase-shifter 16. The delayed short-pulsed microwave in time, that is, the short-pulsed microwave positioned in the right side of the point B in the tube 14 travels in the right side of the tube 14 and comes to the magic tee 15 by the circulator 13 provided between the first tube 12 and the second tube 14 without returning to the first tube 12.

Then, the preceding and the delayed short-pulsed microwaves are aligned in their phases by the phase-shifter 16 and are superimposed by the magic tee 15. Accordingly, the short-pulsing of the microwave from the microwave oscillator and the substantially two-fold increase of the amplitude intensity of the microwave can be performed at the same time.

That is, by using the generating equipment of a short-pulsed microwave as shown in FIG. 2, the short-pulsing of the microwave and the increase of the output power can be performed at the same time.

Herein, in the generating equipment 20 shown in FIG. 2, the similar gas pressure, etc. to ones in the generating equipment 10 may be employed.

EXAMPLES

This invention is concretely described on the following examples, but is not restricted to the examples.

Example 1

In this example, by using the short-pulsed microwave-generating equipment 10 shown in FIG. 1, a microwave was short-pulsed.

As the microwave oscillator 1, a gun oscillator (output power: 5 mW, frequency: 9 GHz) was used. As the waveguided tube, a WRJ 10 was used. As the laser source 4, a fourth harmonic wave (wavelength: 266 nm) of a YAG laser (output power: 160 mJ, pulse width: 6 nsec) was employed. Commercially available ones are employed for the dummy load 3, the microwave detector 5 and the isolator 6.

After tetrakisdimethylaminoethylene (TMAE) was charged into the waveguided tube 2 up to a pressure of 10 mTorr, a laser having a intensity of 0.5 J/cm$^2$ from the laser source 4 was irradiated to the tube 2 and thereby, the TMAE was partially made plasma.

Figure 3:
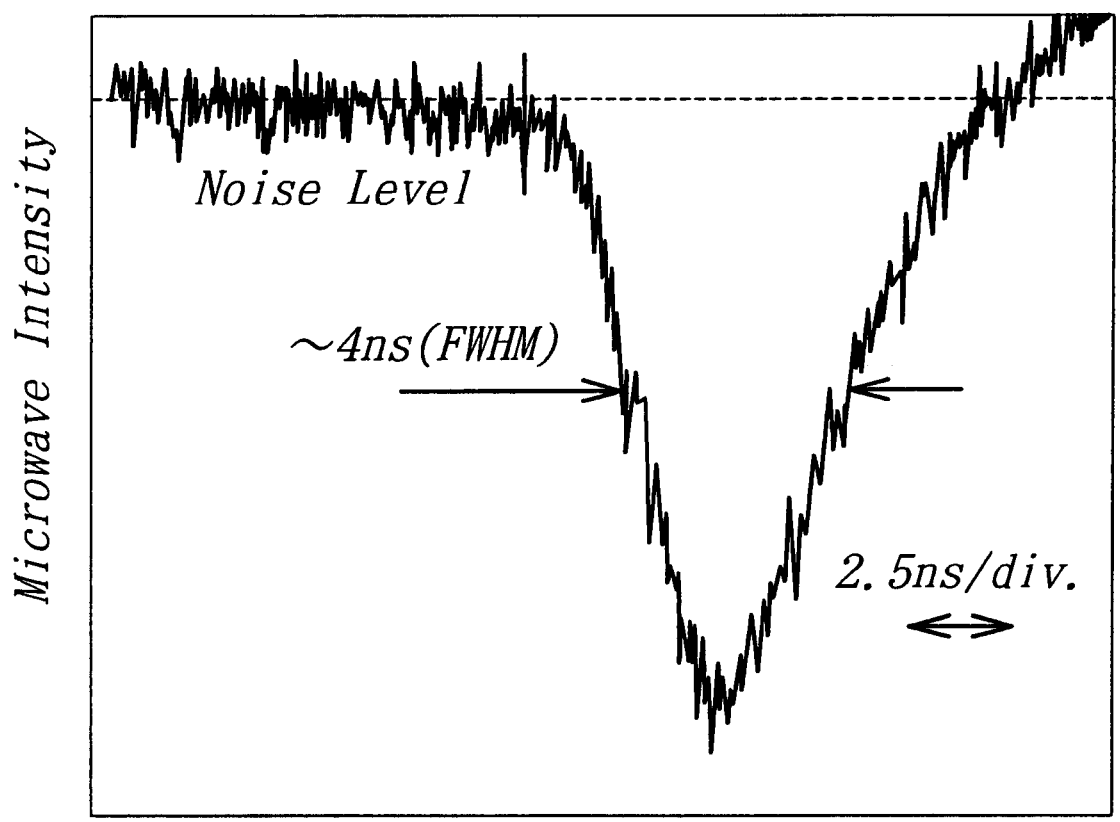
FIG. 3 is a wave profile of a short-pulsed microwave generated by the method according to the present invention.

Thereafter, when the wave profile of the microwave was investigated by the microwave detector 5, it showed the result shown in FIG. 3. The result gives the microwave a pulse width of about 4 nsec. Thus, it is figured out that the microwave having a pulse of 6 nsec is short-pulsed to the one having a pulse of 4 nsec.

Example 2

In this example, by using the short-pulsed microwave-generating equipment 20 shown in FIG. 2, a microwave was short-pulsed and the output power of the short-pulsed microwave was increased.

As the microwave oscillator 1, the laser source 4, the first and the second waveguided tubes 12, 14, the same ones as in Example 1 were employed. Moreover, Commercially available ones are employed for the circulator 13, the magic tee 15 and the phase-shifter 16.

TMAE was introduced into the first and the second waveguided tubes 12 and 14 by the same manner as in Example 1 and thereafter, an oscillated microwave was propagated in the first tube 12 and the second tube 14. Then, a laser was irradiated to the first tube 12 and the second tube 14 by the same manner as in Example 1.

Figure 4:
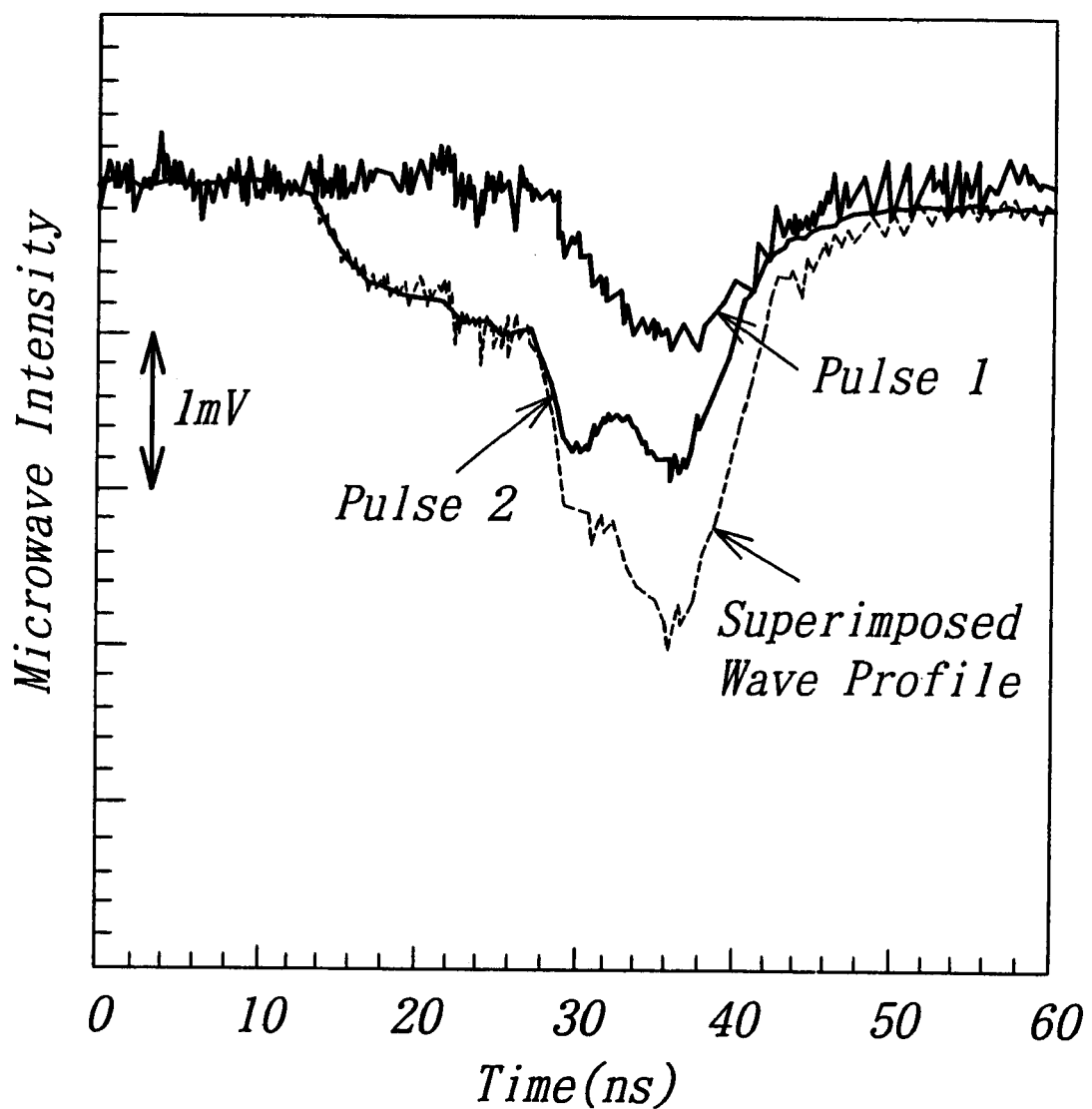
FIG. 4 is a wave profile of another short-pulsed microwave generated by the method according to the present invention.

When the wave profile of the microwave was investigated by the magic tee 15, it showed the result shown in FIG. 4. That is, the microwave is divided into the two microwaves having a pulse 1 (pulse width: 4 nsec) and a pulse 2 (pulse width: 4 nsec), respectively, at the point B in the second waveguided tube 14, which are propagated to the magic tee 15 and are superimposed thereat.

Consequently, in this example, the output power of the microwave is increased at the same time when the microwave is short-pulsed.

Although the present invention was described in detail with reference to the above examples, this invention is not limited to the above disclosure and every kind of variation and modification may be made without departing from the scope of the present invention. For example, the generating equipment may have three or more waveguided tubes which have circulators in each connecting part therebetween. The generating equipment can produce larger output power than that of the equipment in FIG. 2.

The generating method and the generating equipment according to the present invention divides the microwave by taking advantage of the nature that the microwave can not travel in the waveguided tube beyond the plasma part generated by making plasma the gas in the tube through the laser irradiation. Accordingly, without restriction by an electric circuit, the microwave can be easily short-pulsed.

Moreover, according to the present invention, the output power of the short-pulsed microwave can be increased at the same time of the short-pulsing through superimposing of the plural short-pulsed microwaves.

What is claimed is:

1. A method for generating a short-pulsed microwave comprising the steps of:

charging a given gas into a waveguided tube;

propagating a continuous or a long-pulsed microwave in the waveguided tube without resonance in the waveguided tube; and making plasma the given gas partially by irradiating a laser to the tube in its cross sectional direction and thereby, dividing the continuous or the long-pulsed microwave with the plasma-part of the given gas to obtain a short-pulsed microwave.

2. A method for generating a short-pulsed microwave as defined in claim 1, wherein the pressure of the given gas charged into the waveguided tube is 1–30 mTorr.

3. A method for generating a short-pulsed microwave as defined in claim 1, wherein the given gas is tetrakisdimethylaminoethylene.

4. A method for generating a short-pulsed microwave as defined in claim 1, wherein the intensity of the laser is 0.5–0.8 J/cm$^2$.

5. A method for generating a short-pulsed microwave as defined in claim 1, wherein the wavelength of the laser is not more than 248 nm.

6. A method for generating a short-pulsed microwave as defined in claim 1, wherein the short-pulsed microwave has a pulse width of 2–10 nsec.

7. A method for generating a short-pulsed microwave as defined in claim 1, wherein the continuous or the long-pulsed microwave is divided into plural short-pulsed microwaves and the short-pulsed microwaves are superimposed.

8. A method for generating a short-pulsed microwave as defined in claim 7, wherein the waveguided tube is composed of a first waveguided tube and a second waveguided tube which are connected with a circulator and the given gas charged into the first and the second waveguided tubes are partially made plasma by irradiating the laser to the first and the second waveguided tubes in their cross sectional directions, the continuous or the long-pulsed microwave being divided at the plasma-parts of the given gas in the tubes to obtain the plural short-pulsed microwaves which are separated by the circulator, and thereafter, the plural short-pulsed microwaves are superimposed.

9. A short-pulsed microwave-generating equipment comprising:

a microwave oscillator to oscillate a continuous or a long-pulsed microwave;

a waveguided tube to propagate the continuous or the a long-pulsed microwave without resonance in the waveguided tube; and a laser source to generate and oscillate a laser to make plasma a given gas charged into the waveguided tube.

10. A short-pulsed microwave-generating equipment comprising:

a microwave oscillator to oscillate a continuous or a long-pulsed microwave;

a first and a second waveguided tubes to propagate the continuous or the long-pulsed microwave without resonance in the first and the second waveguided tubes;

a circulator to connect the first and the second waveguided tube; and a laser source to generate and oscillate a laser to make plasma a given gas charged into the first-and the second waveguided tubes.

11. A method for generating a short-pulsed microwave as defined in claim 2, wherein the given gas is tetrakisdimethylaminoethylene.

12. A method for generating a short-pulsed microwave as defined in claim 2, wherein the intensity of the laser is 0.5–0.8 J/cm$^2$.

13. A method for generating a short-pulsed microwave as defined in claim 2, wherein the wavelength of the laser is not more than 248 nm.

14. A method for generating a short-pulsed microwave as defined in claim 2, wherein the short-pulsed microwave has a pulse width of 2–10 nsec.

15. A method for generating a short-pulsed microwave as defined in claim 2, wherein the continuous or the long-pulsed microwave is divided into plural short-pulsed microwaves and the short-pulsed microwaves are superimposed.

* * * * *